Aug. 2, 1960 T. E. PARDUE 2,947,923

TRANSISTOR PROCESS AND PRODUCT

Filed Nov. 3, 1955

Inventor:
Turner E. Pardue
By: Mueller & Aichele
Attys.

2,947,923

TRANSISTOR PROCESS AND PRODUCT

Turner E. Pardue, Tempe, Ariz., assignor to Motorola, Inc., Chicago, Ill., a corporation of Illinois Filed Nov. 3, 1955, Ser. No. 544,699
17 Claims. (Cl. 317—235)

The present invention relates to an improved process for fabricating transistors and to an improved product resulting therefrom. More particularly, the invention relates to the construction of high frequency transistors using a semiconductor crystal with a zone therein of high or intrinsic conductivity characteristics.

Since the original development of the junction transistor, many advances have been made in the art in extending its useful frequency range. These advances have brought the performance of the commercial junction transistor close to the optimum possible with that particular structure and available techniques. The concept of the intrinsic barrier transistor represents an attempt to alter the structure of the original junction transistor in such a manner that the useful frequency range of the resulting transistor is materially greater than the range of the ordinary junction transistor.

This latter type of transistor may be either the p-n-i-p type or the n-p-i-n type. In such a transistor, an intrinsic collector zone is provided in the crystal to reduce the collector capacitance and increase the collector breakdown voltage. Devices of this general type are discussed in the Bell System Technical Journal for May 1954, in an article by J. M. Early starting on page 517. As described in this article, the structure referred to above permits the simultaneous achievement of high alpha cutoff frequency, low ohmic base resistance, low collector capacitance and high collector break-down voltage.

Transistors of this general type are known variously as the p-n-i-p (or its homologue the n-p-i-n), the drift transistor or the diffused base transistor. The unit was usually made in the prior art by preparing a mono-crystal wafer of semiconductor material composed of a first thin lamellar region of a selected conductivity type and an adjacent lamellar region of intrinsic semiconductor. It is usual in present day practice to use germanium for the semiconductor crystal, and for the first lamellar region to be of the negative conductivity or n-type. However, other semiconductor materials such as silicon can be used, and the crystal can be an n-i-type structure or a p-i-type depending on whether a p-n-i-p or n-p-i-n transistor is desired.

The thin lamellar region of the selected conductivity type was usually formed in the prior art by diffusing a suitable impurity into an intrinsic semiconductor wafer. This diffusion was effectuated by placing the wafer in an atmosphere of the impurity vapor at elevated temperatures. This resulted in the creation of a thin layer of the selected conductivity type on all surfaces of the wafer, and this layer was later removed from one face of the wafer by lapping and/or etching. This produced a semiconductor wafer having an intrinsic zone and an adjacent zone of a selected conductivity type. Further in accordance with prior art practice, rectifying junctions were then applied to the opposite faces of the crystal, usually by the alloy junction technique, with the ohmic base connection being made to the region of the selected conductivity type.

Although the construction described above does result in a superior and satisfactory high frequency transistor, it has proved difficult to construct by that method transistors answering the theoretical requirements for satisfactory high frequency operation. That is, the problem prior to the present invention has been to find a practical technique for producing a commercial structure that approaches in design the theoretical requirements for optimum performance, and which technique is capable of being carried out sufficiently economically so as to make the process commercially feasible and the resulting unit relatively inexpensive.

It is, accordingly, an object of the present invention to provide an improved, simple and effective method for fabricating transistors of the type described above.

Another object of the invention is to provide an improved transistor unit fabricated in accordance with the method or process of the present invention.

A feature of the invention is the provision of rectifying contacts on high resistivity semiconductor wafer having a surface layer of a selected conductivity type; which contacts are formed by means of a jet-etch-plate technique, with one contact being formed in contact with the surface layer, and the other in a cavity and in contact with the high resistivity region of the semiconductor.

The above and other features of the invention which are believed to be new are set forth with particularity in the appended claims. The invention itself, however, together with further objects and advantages thereof, may best be understood by reference to the following description when taken in conjunction with the accompanying drawing in which:

The invention provides an improved process for fabricating a transistor, which process comprises providing a semiconductor crystal wafer of high resistivity diffusing an impurity into the crystal wafer to provide a surface layer of the same conductivity type but of lower resistivity over all the surfaces of the crystal, directing a first jet composed of a chemical solution of a salt of a selected metal onto one face of the crystal, passing an electric current through the jet and the crystal to etch slightly that face without penetrating the surface layer, reversing the current through the jet to plate a first electrode on the face in rectifying contact with the surface layer, directing a second jet composed of a chemical solution of a salt of a selected metal onto the opposite face of the crystal, passing an electric current through the second jet and through the crystal to etch a cavity in the opposite face which penetrates into the crystal beyond the surface layer, and reversing the current through the second jet and through the crystal to plate a second electrode at the bottom of the cavity directly opposite the first electrode and in rectifying contact with the high resistivity portion of the crystal.

A specific example of the improved process of the invention will now be described. It is to be understood and it will be evident as the description proceeds, that the process does not depend upon any specific material or upon any specific dimensions, and that these may vary without departing from the scope and spirit of the invention. Materials and dimensions will be listed herein merely by way of example, but they are not to be construed as limiting the invention in any way.

Figure 1:
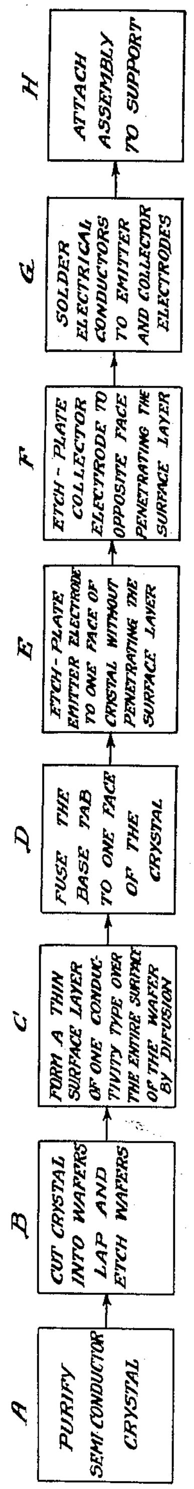
Fig. 1 represents various steps included in the process of the invention.

In practicing the invention, it is necessary to provide thin semiconductor wafers composed, for example, of high resistivity, or nearly intrinsic, germanium. These wafers may be provided by purifying a block of germanium (step A in Fig. 1). This purification may conveniently be carried out by the zone purifying process described by Pfann in the Transactions of the American Institute of Metallurgical Engineers, Journal of Metals, July 1952, page 747, "Principles of Zone Melting." It is possible by this process to obtain highly purified and near intrinsic germanium with the resistivity desired, that is, with a resistivity in the region of 20 ohm centimeters more or less.

The crystal block is then cut into wafers (step B) by any known cutting processes using, for example, a thin diamond or silicon carbide wheel. It is desirable (but not essential) that these wafers be formed to have their opposite faces parallel to the Miller (111) crystallographic planes in accordance with the teaching of copending application Serial No. 409,329, filed February 10, 1954, in the name of William E. Taylor and assigned to the present assignee.

The wafered crystals are then mechanically lapped or otherwise ground by any known lapping process. After lapping, the wafers are etched so that they have a final dimension of, for example, .0038" x .065" x .120". This etching is accomplished by the use of a suitable etching solution such as:

| | Cc. |
|---|---|
| 70% nitric acid ($HNO_3$) | 5 |
| 52% hydrofluoric acid (HF) | 5 |
| Distilled water | 1 |

Although a rectangular crystal 10 is shown, it is evident that square or circular crystals can be used. These wafers are composed of high resistivity germanium which will be referred to herein as "intrinsic" to distinguish it from the low conductivity zone to be formed therein in a manner to be described.

A thin surface layer of a selected conductivity type is then formed over all the surfaces of each wafer (step C), the layer being of, for example, the negative conductivity or n-type. This surface layer is conveniently formed by exposing the wafer of high resistivity germanium at elevated temperatures to the vapor of a suitable impurity, such as arsenic or antimony. The impurity vapor diffuses into the germanium producing a thin layer of n-type germanium whose resistivity varies from a low value of the order of 0.1 ohm centimeter at the surface to the intrinsic value of 20 ohm centimeters within the crystal, the surface resistivity and the spatial distribution being easily controlled by well-defined parameters (time and temperature and vapor pressure) governing the diffusion process. When antimony is used, the diffusion process is carried out at a temperature of 600–800° C. and for a time interval of 6–24 hours.

The specific diffusion process described in the preceding paragraph produces an n-type surface layer, and any suitable element from the nitrogen group can be used for this purpose. Also, when it is desired to produce a diffused p-type surface layer, the vapor of a suitable element from column III of the periodic table can be used.

Figures 3, 4:
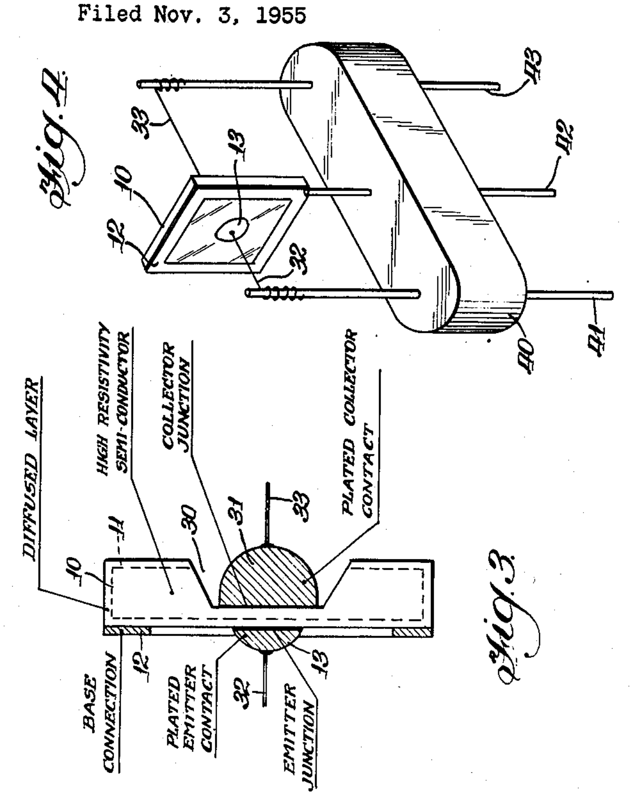
Fig. 3 is a view, partly in section, of a portion of a transistor constructed in accordance with the invention.
Fig. 4 is a perspective view of a transistor constructed by the invention.

Therefore, and as shown in Fig. 3, there is now provided a germanium wafer 10 of near intrinsic characteristics, and having a surface layer 11 of a selected conductivity type, such as negative or n-type. In accordance with step D, a metallic base tab 12 (Figs. 3 and 4) composed, for example, of nickel or tin, is fused to one face of the crystal blank or wafer, namely, the face that is to support the emitter electrode. The tab 12 extends over this face of the wafer, and it has a central aperture therein to permit the emitter electrode to be formed on the blank. The base tab is fused to the face of the wafer by subjecting the assembly to a temperature of 300–600° C.

Figure 2:
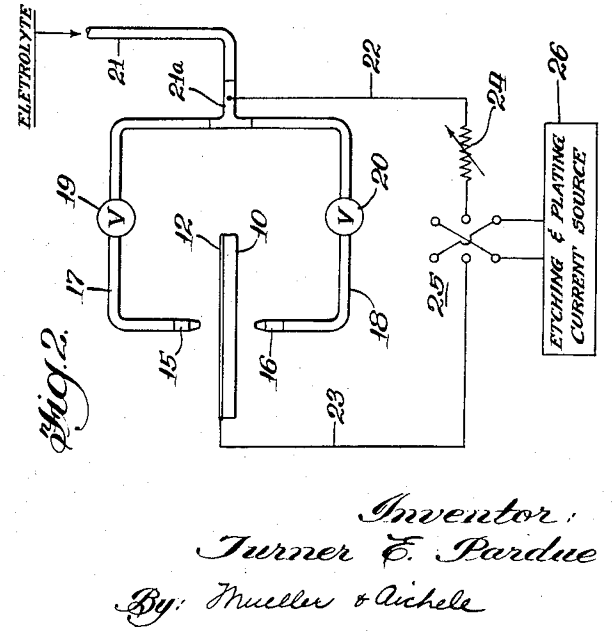
Fig. 2 is a schematic representation of apparatus suitable for use in carrying out the invention.

The assembly is then supported in the apparatus shown schematically in Fig. 2, and this apparatus enables a pair of directly opposing electrolytic jets to be directed at opposite faces of the wafer. The apparatus includes a pair of coaxial nozzles 15 and 16 directed to the opposite faces of wafer 10, and these nozzles are connected by glass tubes 17 and 18 and through respective valves 19 and 20 to a common pipe line 21. The common line has a metal section 21a to which an electrical lead 22 is connected so as to establish electrical connection to the electrolyte solution which is passed therethrough. A further electrical lead 23 is electrically connected to the base electrode 12, and leads 22, 23 are connected through a variable resistor 24 to the center contacts of a reversing switch 25. The reversing switch is connected to a source of direct current 26.

In accordance with step E, valve 20 is closed and valve 19 is opened so that an electrolytic solution passes through tubes 21, 21a, 17 to issue as a jet from nozzle 15. Switch 25 is placed in a position so that a D.C. current from source 26 flows through the electrolyte and the wafer 10 in a direction to produce an etching action between the jet from nozzle 15 and the surface of the wafer lying in the aperture in the base electrode 12. Light is directed onto the surface of the crystal wafer during the etching action to illuminate the surface and aid the etching action by increasing the flow of minority carriers in the wafer, as is understood by the art. The amount of current is controlled by resistor 24 and is adjusted to .002 amp. After a predetermined slight time interval of for example, 15 seconds, and when no appreciable depth of etching has been produced, the current is reversed, the illumination is removed, and the emitter electrode 13 (Figs. 3 and 4) is electroplated on the face of the wafer. The etching is so slight that the resulting etched cavity does not penetrate beyond the surface layer 11, so that the emitter electrode is in rectifying contact with that surface layer.

The emitter electrode may be formed of zinc in accordance with the teaching of copending application No. 544,915, now abandoned, filed November 4, 1955, in the name of Preston Heinle and E. T. Pardue. To produce zinc electrodes, and as described in the copending application, the electrolyte has the following composition:

| | Grams per litre |
|---|---|
| Zinc sulphate ($ZNSO_4.7H_2O$) | 15 to 75 |
| Ammonium acetate ($CH_3CONH_4$) | 5 to 30 |
| Ammonium chloride ($NH_4Cl$) | 5 to 75 |

Valve 19 is now closed and valve 20 opened to permit the electrolyte to issue as a jet from nozzle 16. Switch 25 is placed in a position so that the D.C. current flows in the etching direction, and the etching action of the jet from nozzle 16 is allowed to continue until the etched cavity 30 (Fig. 3) formed thereby in the wafer penetrates into the wafer beyond the surface layer 11 and into the intrinsic portion. As before, the surface is illuminated to aid the etching action. The time of this etch is about 200 seconds with a D.C. current of .003 ampere. Switch 25 is now reversed and the collector electrode 31 is plated at the bottom of cavity 30 directly opposite the emitter electrodes and in rectifying contact with the intrinsic portion of the wafer 10. This electrode, like the emitter, may be composed of zinc so that the same electrolyte can be used for both.

Suitable leads 32, 33 may be soldered respectively to the emitter collector electrodes (step G) by any suitable soldering or welding technique. The unit may then be mounted in a standard support (step H) which is shown in Fig. 4. This support usually comprises an insulating body 40 having three rigid leads 41, 42 and 43 extending therethrough. Lead 42 is welded or soldered to the base tab 12, and conductors 32 and 33 are connected in any suitable manner to respective leads 41 and 43.

Any suitable known etching and cleaning operations can be made to the unit. For example, the assembly may be subjected to an electrolytic etch such as described in copending application 455,575, filed September 13, 1954, in the name of Charles Ackerman and assigned to the present assignee. The transistor may also be given a suitable surface coat, using, for example, Dow Corning 997, silicon varnish mixed with xylene, as described in the copending application No. 544,915, noted above. The assembly may then be potted and placed in a suitable enclosure and cover and subjected to a final test.

The invention provides, therefore, a relatively simple and economical process for fabricating high frequency transistors using a high resistivity zone in the semiconductor. By means of the present process, the diffusion of the surface layer can be accurately controlled, and the formation of plated rectifying contacts may also be accurately controlled so that the geometry of the finished unit can be made to approach the theoretical configuration required for satisfactory high frequency operation, and this can be achieved conveniently and on a commercially feasible basis.

I claim:

1. A process for forming a transistor which comprises providing a semiconductor crystal wafer of relatively high resistivity, diffusing an impurity substance into the crystal to form a surface layer of one conductivity type and of relatively low resistivity over all the surfaces of the crystal, forming a first electrode on one face of the wafer in rectifying contact with the surface layer, etching a cavity in the other face of the wafer opposite said first electrode and penetrating into said crystal beyond said surface layer, and forming a second electrode on the bottom of said cavity directly opposite said first electrode and in rectifying contact with the high resistivity portion of the crystal.

2. A process for forming a transistor which comprises providing a semiconductor crystal wafer of high resistivity and having a surface layer of one conductivity type and of relatively low resistivity over the surfaces of the crystal, forming a first rectifying contact on one face of the wafer, forming a cavity in the other face of the wafer penetrating into the crystal beyond said surface layer, and forming a second rectifying contact at the bottom of said cavity.

3. A process for forming a transistor which comprises providing a semiconductor crystal wafer of a high resistivity of the order of 20 ohm centimeters and having a surface layer of one conductivity type and of a low resistivity of the order of 0.1 ohm centimeter over all the surfaces of the crystal, electroplating a first rectifying contact on one face of the wafer on said surface layer, etching a cavity in the other face of the wafer penetrating into the crystal beyond said surface layer, and electroplating a second rectifying contact directly opposite said first contact on the high resistivity portion of said crystal at the bottom of said cavity.

4. A process for fabricating a transistor which comprises providing a semiconductor crystal wafer of essentially the intrinsic type and having a surface layer of one conductivity type over all the surfaces of the crystal, directing an electrolytic jet onto one face of the wafer, passing an electric current through the jet and the wafer to plate a first electrode on said face in rectifying contact with said surface layer, directing an electrolytic jet onto the opposite face of the wafer, passing an electric current through said last-named jet and the crystal wafer to etch a cavity in such opposite face penetrating into the crystal beyond said surface layer, and reversing the current through said crystal and last-named jet to plate a second electrode at the bottom of said cavity directly opposite said first electrode and in rectifying contact with the intrinsic portion of the crystal.

5. A process for fabricating a transistor which comprises providing a semiconductor crystal wafer of essentially the intrinsic type and having a resistivity of the order of 20 ohm centimeters, diffusing an impurity into the wafer to provide a surface layer of one conductivity type over all the surfaces of the crystal having a resistivity of the order of 0.1 ohm centimeter, directing a first jet composed of a solution of a salt of a selected metal onto one face of the crystal wafer, passing an electric current through the jet and the wafer to etch slightly said face without penetrating said surface layer, reversing the current through said jet to plate a first electrode on said face in rectifying contact with said surface layer, directing a second jet of a salt of a selected metal onto the opposite face of the crystal wafer, passing an electric current through said second jet and the wafer to etch a cavity in such opposite face penetrating into the crystal beyond the surface layer, and reversing the current through said second jet and crystal to plate a second electrode at the bottom of said cavity directly opposite said first electrode and in rectifying contact with the intrinsic portion of the crystal.

6. The process of claim 5 in which said impurity is chosen from the group including antimony and arsenic to provide an n-type surface layer.

7. The process of claim 5 in which said first and second jets are formed of a solution of zinc sulphate, ammonium acetate and ammonium chloride.

8. A transistor comprising a semiconductor crystal wafer of relatively high resistivity and having a surface layer of one conductivity type and of relatively low resistivity, a first rectifying contact on one face of said crystal wafer in contact with said surface layer, the opposite face of said wafer having a cavity therein penetrating into the crystal beyond said surface layer, and a second rectifying contact at the bottom of said cavity in contact with the high resistivity portion of the crystal.

9. A transistor comprising a semiconductor crystal wafer of essentially the intrinsic type and having a surface layer of one conductivity type over all the surfaces of the crystal, a first electro-plated electrode formed on one face of the crystal wafer in rectifying contact with said surface layer, a base electrode fused to said one face of the wafer in ohmic contact with said surface layer, the opposite face of said crystal wafer having a cavity therein penetrating into the crystal beyond said surface layer, and a second electro-plated electrode at the bottom of said cavity directly opposite said first electro-plated electrode and in rectifying contact with the intrinsic portion of said crystal.

10. The transistor defined in claim 9 in which said semiconductor crystal is composed of a material chosen from a group including silicon and germanium.

11. The transistor defined in claim 9 in which said surface layer is of the negative conductivity type.

12. The transistor defined in claim 9 in which said first and second electro-plated electrodes are composed of zinc.

13. A process for forming a transistor which comprises providing a semiconductor crystal wafer, diffusing an impurity substance into the crystal to provide therein a first region having the original characteristics of the crystal with a diffused surface layer of one conductivity type over all the surfaces of the crystal, etching a cavity in one face of the wafer penetrating into the crystal beyond the surface layer, electro-plating a first metallic electrode on the other face of the wafer opposite said cavity and in rectifying contact with the surface layer, and electro-plating a second metallic electrode on the bottom of said cavity directly opposite said first electrode and in rectifying contact with said first region.

14. A transistor comprising a semiconductor crystal wafer having therein a first region of selected characteristics and further having a diffused surface layer of one conductivity type, one face of the wafer having a cavity therein extending into the crystal through said diffused surface layer, a first metallic electrode electro-plated onto the bottom of said cavity in rectifying contact with said first region, and a second electro-plated metallic electrode on the other face of the wafer directly opposite said first electrode and in rectifying contact with said surface layer.

15. A process for making a semiconductor device which comprises providing a semiconductor crystal wafer having two opposite face areas, diffusing by gaseous diffusion an impurity into each face area to provide at each such face area a surface layer, with said crystal wafer retaining a region intermediate said surface layers in the original condition of such crystal wafer, forming a cavity by jet-etching extending through one of said surface layers and into said intermediate region of the crystal wafer, applying a contact in said cavity at the bottom thereof, and applying a second contact at the surface layer of the crystal wafer opposite to the surface layer through which the cavity is formed and with said second contact positioned opposite to said cavity.

16. A transistor comprising a semiconductor crystal body having a substrate layer of relatively high resistivity and surface layers on opposite sides thereof, each of said surface layers blending with said substrate layer and having a resistivity gradient therein with the resistivity in said surface layers decreasing toward the exterior of said body, a connection on one of said surface layers, means forming a cavity extending through the other surface layer, and a connection to said substrate layer at the bottom of the cavity.

17. A process for making a transistor which comprises treating a semiconductor crystal body to provide a body having a substrate layer of relatively high resistivity and surface layers on opposite sides thereof which surface layers blend with said substrate layer and having a resistivity gradient therein with the resistivity in said surface layers decreasing toward the exterior of said body, forming a cavity extending through one of said surface layers and exposing said substrate layer, forming a connection to the exposed substrate layer and forming a connection to the other surface layer.

References Cited in the file of this patent

UNITED STATES PATENTS

| | | |
|---|---|---|
| 2,666,814 | Shockley | Jan. 19, 1954 |
| 2,764,642 | Shockley | Sept. 25, 1956 |
| 2,820,154 | Kurshan | Jan. 14, 1958 |